United States Patent [19]

Fukada et al.

[11] Patent Number: 5,017,828
[45] Date of Patent: May 21, 1991

[54] IMAGE SENSOR

[75] Inventors: Takeshi Fukada, Ebina; Mitsunori Sakama, Hiratsuka; Nobumitsu Amachi, Takarazuka; Naoya Sakamoto, Atsugi; Mitsufumi Codama; Toru Takayama, Atsugi, all of Japan

[73] Assignee: Semiconductor Energy Laboratory Co., Ltd., Kanagawa, Japan

[21] Appl. No.: 342,857

[22] Filed: Apr. 25, 1989

[30] Foreign Application Priority Data

Apr. 30, 1988 [JP] Japan ................................ 63-107958

[51] Int. Cl.$^5$ ...................... H01J 31/26; H01L 27/14
[52] U.S. Cl. .................................... 313/367; 313/365; 313/366; 357/32; 357/30
[58] Field of Search .................... 357/30, 30 K, 31, 32; 313/365, 366, 367; 358/44, 46, 49

[56] References Cited

U.S. PATENT DOCUMENTS 4,754,152  6/1988  Hayama et al. .................. 357/30 K
4,868,623  9/1989  Nishiura ............................. 357/32

Primary Examiner—Donald J. Yusko
Assistant Examiner—Diab Hamadi
Attorney, Agent, or Firm—Sixbey, Friedman, Leedom & Ferguson

[57] ABSTRACT

An improved image sensor made of photosensitive semiconductor materials with a number of pixels each including an n-type semiconductor layer, a p-type semiconductor layer and an intrinsic semiconductor layer disposed between the n-type and p-type layers. The n-type and p-type layers are made from a semiconductor material having a high resistivity. The high resistivity of the n-type layer and the p-type layer functions to prevent crosstalk currents from passing between the pixels.

6 Claims, 2 Drawing Sheets

IMAGE SENSOR

BACKGROUND OF THE INVENTION

The present invention relates generally to an image sensor and relates more particularly to a crosstalk-proof image sensor.

Image sensors comprising photosensitive semiconductor devices are suitable for constructing compact type facsimile machines, copying machines, image scanners and the like. An example of such prior art image sensors is illustrated in FIGS. 1(A) to 1(C) for fasilitating the understanding of the background of the present invention. The image sensor is a line sensor which is provided with a row of photosensitive regions. FIG. 1(A) is a plan view of an electrode arrangement. A number of electrode strips are formed in parallel together with head portions 1 located just above the underlying photosensitive regions. Each head portion is connected with a driving IC through a lead portion 2 and a contact 4 by means of wiring 3.

FIG. 1(B) is an expanded view of the head portions of the electrode arrangement and FIG. 1(C) is a cross sectional view taken along a—a line of FIG. 1(B). The photosensitive region is comprised of a transparent common electrode 6 formed just on a glass substrate 5, a photosensitive semiconductor layer consisting of a p-layer 8, an i-layer 9 and an n-layer 10 and an opposed electrode layer 7 stacked in this order. The photosensitive semiconductor layer and the opposed electrode layer are divided into a row of photosensitive regions by grooves 11. The groove is provided for avoiding current leakage between adjacent photosensitive regions.

The grooves 11 are formed by etching after deposition of the respective layers. During the etching process, however, the photosensitive regions are often damaged. The grooves 11 may receive some debris which may form bypass current paths between the layers. The formation of this grooves 11 is indispensable in order to avoid crosstalk between pixels because the ratio of the resistance of the layer 10 in a lateral direction to the resistance in the direction normal to the layered structure is only 10 or lower. The ratio can be increased by making use of amorphous silicon semiconductor to some extent. However, the ratio is not so low as to dispense with the formation of the grooves.

SUMMARY OF THE INVENTION

It is therefore an object of the present invention to provide an image sensor which can be produced at a high yield of product.

It is another object of the present invention to provide a highly reliable image sensor.

It is a further object of the present invention to provide an image sensor of which photosensitivity has been increased.

In order to accomplish the above and other objects and advantages, it is proposed to make use of a photosensitive semiconductor region with carrier collection layers made of semiconductor materials having a relatively high resistivity in which a space charge region is created. For example, the photosensitive semiconductor region consists of an n-type layer, an i-type layer and a p-type layer stacked in this order, and a pair of electrodes provided outside of the n-type and p-type layers for outputting. The n-type and p-type layers are made of the material of a high resistivity. Photo-created carriers are drifted by virtue of an electric field induced in the depletion layer across the i-type layer toward the outside regions of the n-type and p-type layers on which the pair of electrodes are formed. Although collected carriers in the n-type and p-type layers produce differential potentials between pixels, the high resistivity of the n-type and p-type layers functions to reduce undesirable currents passing across the pixels. The preferable materials suitable for the layer of a high resistivity are silicon nitride and silicon carbide.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Figure 1A:
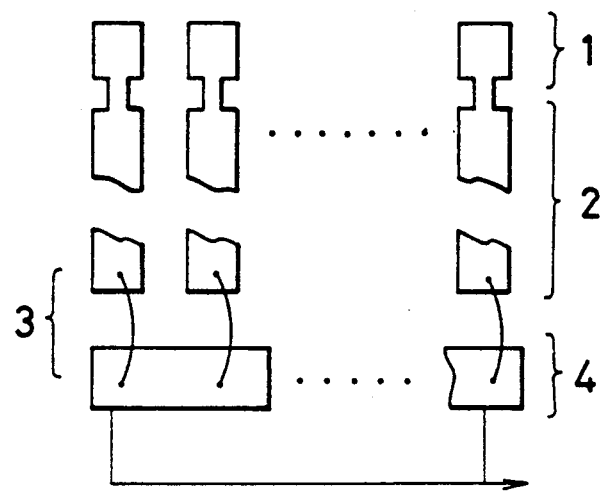
FIGS. 1(A) and 1(B) are plan and expanded views showing an electrode arrangement defining pixels of an image sensor.
Figure 1B:
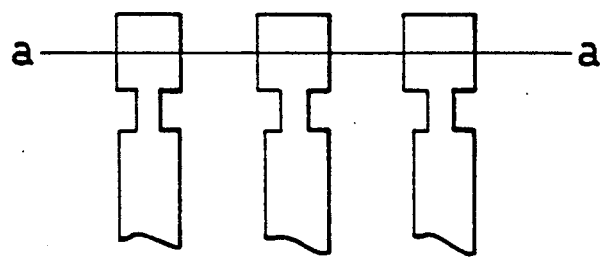
Figure 1C:
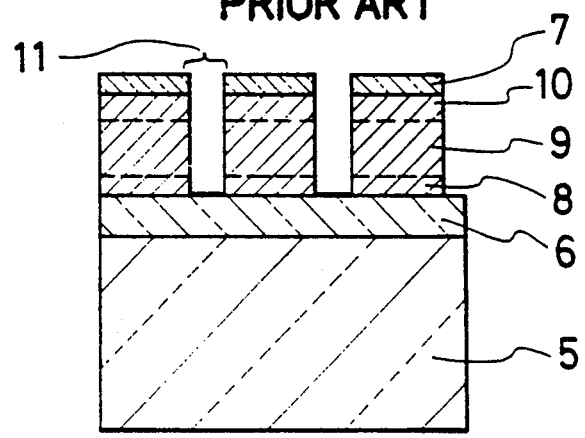
FIG. 1(C) is a cross sectional view showing a prior art image sensor.
Figure 2:
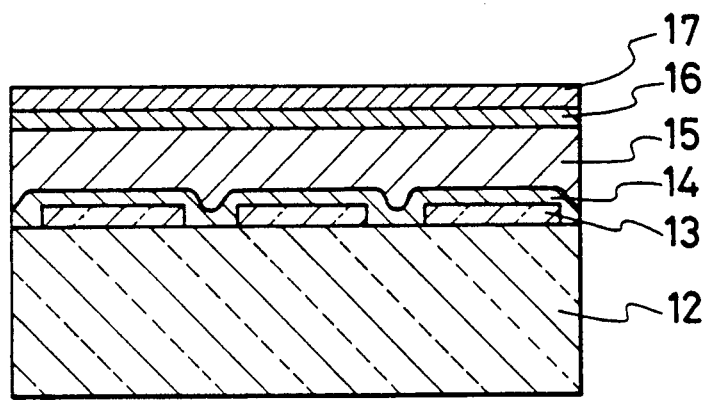
FIG. 2 is a cross sectional view showing an image sensor in accordance with an embodiment of the present invention.

Referring now to FIG. 2, an image sensor in accordance with an embodiment of the present invention is illustrated. The sensor comprises a glass substrate 12, a plurality of transparent electrode strips 13 arranged in a row, an n-type amorphous silicon nitride semiconductor film 14, an intrinsic (i-type) amorphous silicon semiconductor film 15 and a p-type amorphous silicon nitride semiconductor film 16 and a aluminium common electrode 17. Each electrode strip 13 defines a photosensitive region with corresponding portions of the semiconductor films 14, 15 and 16 and the common electrode 17 overlying them. Three photosensitive regions are illustrated in FIG. 2. the geometry of the electrodes 13 may be equivalent to that illustrated in FIGS. 1(A) and 1(B).

The resistances of the silicon nitride films 14 and 16 measured in a lateral direction parallel therewith were not less than $1 \times 10^{10}$ ohm. The ratios of the lateral resistances to the resistance normal to the film were not less than 100. By this construction, crosstalk among the respective photosensitive regions could be avoided even without separating the photosensitive regions by grooves. If light to be sensed is incident from the common electrode side, the common electrode 17 has to be transparent. In this case, the electrode strips 13 have not to be transparent and the substrate may be another opaque insulating substrate.

Figure 3:
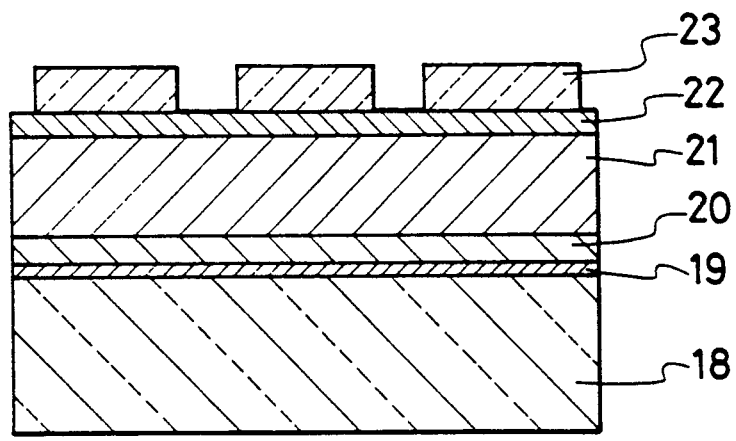
FIG. 3 is a cross sectional view showing an image sensor in accordance with another embodiment of the present invention.

FIG. 3 illustrates another embodiment in accordance with the present invention. This embodiment will be described by way of its manufacturng process. Chromium is deposited on a Corning #7059 glass substrate in order to form a common electrode 19 of 1000 Å thickness. An n-type amorphous silicon carbide semiconductor film 20 is deposited on the common electrode 19 by plasma CVD using, as reactive gases, $SiH_4$, $CH_4$ and $PH_4$ to a thickness of 300 Å. An i-type amorphous silicon semiconductor film 21 is deposited on the n-type semiconductor film by plasma CVD using $SiH_4$ to a thickness of 1 micron. Furthermore, a p-type amorphous silicon carbide semiconductor film 22 is deposited to a thickness of 300 Å by plasma CVD using SiH$_4$, CH$_4$ and BH$_4$. Finally, electrode strips 23 made of a transparent conductive material such as indium tin oxide are formed on the p-type film to a thickness of 1500 Å in order to define photosensitive regions of photodiode structure.

For example, the reactive gases employed for embodying the present invention may be, as the silicon source SiH$_4$, Si$_2$H$_6$ or Si$_3$H$_8$, as the carbon source CH$_4$, C$_2$H$_2$, C$_2$H$_4$ or C$_2$H$_6$, as the nitrogen source N$_2$ or NH$_3$, as the dopant gas PH$_3$ or B$_2$H$_6$. Each reactive gas is introduced together with a carrier gas such as He or H$_2$.

In accordance with experiment, the photosensitivity of the image sensor was increased by about 30% because the photosensitive structure was not damaged during the manufacturing process. Of course, the photosensitive semiconductor films can be formed with pin, nip, ip, np, pi or ni junctions.

While several embodiments have been specifically described by way of examples, it is to be appreciated that the present invention is not limited to the particular examples described and that modifications and variations can be made without departing from the scope of the invention as defined by the appended claims.

What is claimed is:

1. An image sensor comprising:
    a pair of electrodes for defining a plurality of sensor elements, at least one of said pair being transparent;
    a photosensitive semiconductor layer disposed between said pair of electrodes for forming said sensor elements,
    wherein the portions of said photosensitive semiconductor layer which contact said pair of electrodes are comprised of either silicon carbide or silicon nitride, and wherein said photosensitive semiconductor layer forming each of said sensor elements is contiguous with the adjacent sensor elements.

2. The sensor of claim 1 wherein said portions are amorphous silicon nitride or amorphous silicon carbide.

3. The sensor of claim 1 wherein said photosensitive semiconductor layer comprises an n-type layer, a p-type layer and i-type layer disposed between said n-type and p-type layers, said n-type and p-type layers comprising said silicon carbide or silicon nitride.

4. The sensor of claim 3 wherein said n-type, i-type and p-type layers are made from at least one kind of amorphous semiconductor material.

5. The sensor of claim 3 wherein said n-type and/or p-type layers are formed continuously extending over a plurality of pixels.

6. The sensor of claim 1 wherein said photosensitive semiconductor layer is formed continuously extending over a plurality of pixels.

* * * * *